(12) United States Patent
Sato

(10) Patent No.: US 7,119,561 B2
(45) Date of Patent: Oct. 10, 2006

(54) ELECTRICAL CONNECTING APPARATUS

(75) Inventor: Minoru Sato, Hiraka-machi (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 11/026,301

(22) Filed: Dec. 29, 2004

(65) Prior Publication Data

US 2005/0124144 A1    Jun. 9, 2005

Related U.S. Application Data

(63) Continuation-in-part of application No. PCT/JP03/11117, filed on Feb. 17, 2003.

(51) Int. Cl.
*G01R 31/02* (2006.01)

(52) U.S. Cl. ...................................... 324/754

(58) Field of Classification Search ............... None
See application file for complete search history.

(56) References Cited

U.S. PATENT DOCUMENTS

| | | | | |
|---|---|---|---|---|
| 4,423,376 A | * | 12/1983 | Byrnes et al. | 324/756 |
| 4,554,506 A | * | 11/1985 | Faure et al. | 324/761 |
| 5,385,477 A | * | 1/1995 | Vaynkof et al. | 439/66 |
| 5,410,260 A | * | 4/1995 | Kazama | 324/758 |
| 6,417,684 B1 | * | 7/2002 | Schmid et al. | 324/761 |
| 6,563,332 B1 | * | 5/2003 | Goto et al. | 324/761 |
| 6,876,530 B1 | * | 4/2005 | Parker et al. | 361/58 |
| 6,953,348 B1 | * | 10/2005 | Yanagisawa et al. | 439/66 |

FOREIGN PATENT DOCUMENTS

| | | |
|---|---|---|
| JP | 62-144080 A | 6/1987 |
| JP | 62-203461 | 12/1987 |
| JP | 04-278476 A | 10/1992 |
| JP | 08-201427 | 8/1996 |
| JP | 11-030630 A | 2/1999 |
| JP | 2002-048816 | 2/2002 |
| JP | 2002-202337 A | 7/2002 |
| JP | 2002-365310 | 12/2002 |

* cited by examiner

*Primary Examiner*—Paresh Patel
*Assistant Examiner*—Roberto Velez
(74) *Attorney, Agent, or Firm*—Graybeal Jackson Haley LLP

(57) ABSTRACT

The electrical connecting apparatus according to the present invention includes first, second and third plate members having plate-like portions at intervals from each other in the thickness direction, each plate-like member having a plurality of through holes in the plate-like portions; and a plurality of probes having projected portions passed through the through holes of the first, second and third plate-like members, the probes including projected portions between said first and second plate-like members. Each through hole of the first and second plate-like members has a small diameter portion for preventing the projected portion of the probe from passing and a large diameter portion communicated to the small diameter portion.

8 Claims, 7 Drawing Sheets

Fig. 4A
Fig. 4B
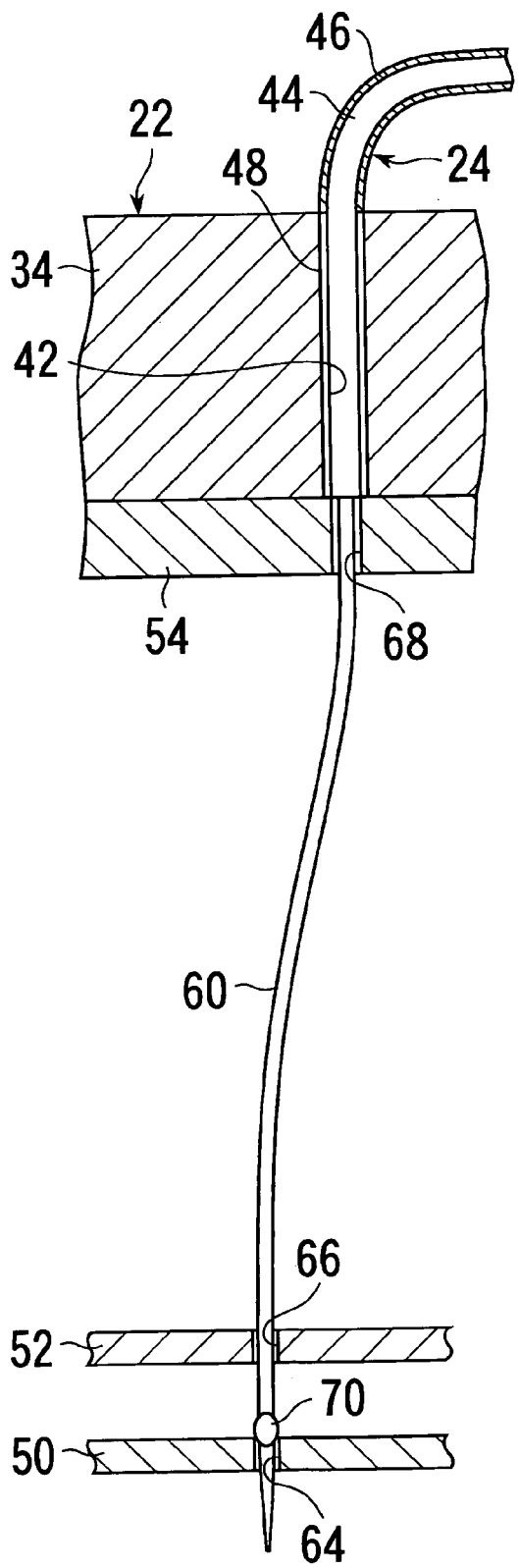
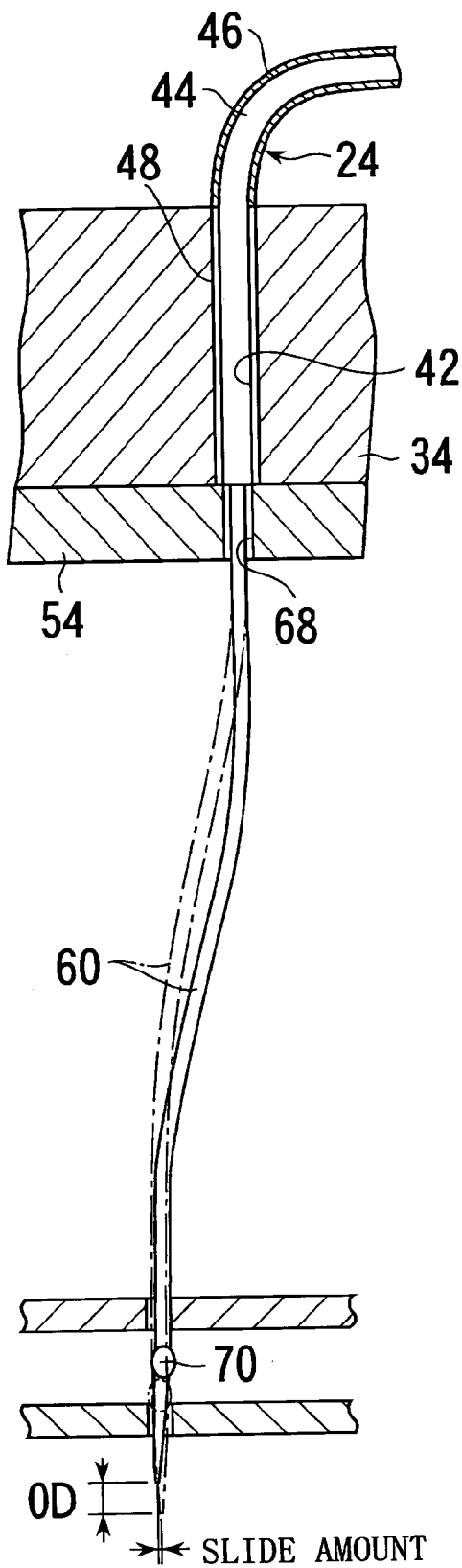

ELECTRICAL CONNECTING APPARATUS

CROSS-REFERENCE TO RELATED APPLICATION

This is a continuation-in-part of co-pending International Application PCT/JP03/11117, filed on 17 Feb. 2003, designating the United States, which is incorporated herein by reference.

FIELD OF ART

The present invention relates to an electrical connecting apparatus such as a probe card for use in an electric test of a semiconductor device such as an integrated circuit.

In the present invention, the extending direction of each probe, namely, the thickness direction of a first, a second and a third plate members through which the probe passes is defined as a vertical direction, and the direction perpendicular to it is defined as a horizontal direction.

BACKGROUND OF ART

A device under test such as a semiconductor device is subjected to an electric test (inspection) as to whether or not its internal circuit acts as defined in a specification. Such an electric test is conducted by using an electric connecting apparatus such as a probe card with a plurality of contacts disposed on the underside of an insulating base plate.

As one of such electric connecting apparatus, there is a vertical type one (e.g., Japanese Patent Appln. Public Disclosure No. 2002-202337) wherein a lower plate and an upper plate are disposed at an interval in the vertical direction interposing a middle plate therebetween, wherein a plurality of needle type probes are assembled into the lower, middle and upper plates so as to penetrate these plates in the vertical direction, and wherein the lower end (needle point) of each probe is pressed against an electrode of the device under test.

A vertical type apparatus, which is easier in assembling probes than a conventional general apparatus with needle type probes bent like an L-shape assembled into a base plate in a cantilever state, is less expensive and can increase the density of arrangement of probes, or needle points, and is suitable for an electric test of a high density device under test having many electrodes.

Also, such a vertical type apparatus has the middle plate displaced in the horizontal direction relative to the upper and lower plates to curve the probes beforehand in the same direction, thereby preventing adjoining probes from coming into contact.

Further, the vertical type apparatus disposes an auxiliary plate above the lower plate at a small interval and forms a projected portion at a position of each probe between the auxiliary plate and the lower plate, thereby preventing the probe from passing through the auxiliary plate and the lower plate.

In the foregoing conventional vertical apparatus, however, the diameter of each probe is so small as approximately fifty microns to 100 microns, so that, unless the diameters of the through holes of the auxiliary and lower plates for the probe to penetrate are made so small as approximately fifty microns to 100 microns, the tip of the probe moves largely within the through holes, which results in dislocation of relative positions of the needle point and the electrode of the device under test. Also, it is difficult to form with high accuracy a through hole having such a small diameter within which the probe tip would not move largely.

DISCLOSURE OF THE INVENTION

An object of the present invention is to enable to form with high accuracy tiny through holes within which a probe tip would not largely move.

The electrical connecting apparatus according to the present invention comprises: a first, a second and a third plate members having plate-like portions at intervals from each other in the thickness direction, each plate-like member having a plurality of through holes in the plate-like portions; and a plurality of probes having projected portions passed through the through holes of the first, second and third plate-like members, the probes including projected portions between said first and second plate-like members. Each through hole of the first and second plate-like members has a small diameter portion for preventing the projected portion of the probe from passing and a large diameter portion communicated to the small diameter portion.

If each through hole of the first and second plate-like members has the small diameter portion and the large diameter portion communicated to each other, such action and effect as follows are resulted.

Since the small diameter portion can be formed after forming the large diameter portion, it is possible to make small the thickness of a position for forming the small diameter portion by forming a deep large diameter portion even if the thickness dimensions of the first and second plate-like members are great. As a result, a small through hole within which the probe tip does not move largely can be formed with high accuracy.

Positioning of the probe tip side in the direction orthogonal to the through holes can be made by an interaction between the small diameter portions of the through holes of the first and second plate-like members, whereby the position of the needle point in the direction orthogonal to the through holes relative to the electrode of a device under test becomes stable.

The small diameter portion of each through hole of the first plate-like member may be positioned opposite to the side of the second plate-like member. By doing so, in comparison with a case where the small diameter portion of the through hole of the first plate-like member is positioned on the side of the second plate-like member, the length of the probe from the needle point to the small diameter portion of the through hole of the first plate-like member becomes small, so that a displacement of the probe in a region from the small diameter portion of the through hole of the first plate-like member to the side of the needle point can be constrained. As a result, a displacement of the needle point in the direction orthogonal to the through holes becomes smaller, and the position of the needle point relative to the electrode of the device under test becomes more stable.

Each through hole of the third plate-like member may have a small diameter portion for preventing the projected portion of the probe from passing through and a large diameter portion communicated to the small diameter portion. By this, even if the thickness of the third plate-like member is large, the thickness of the position to form the small diameter portion can be made small, so that a tiny through hole within which the position of the non-needle-point side of the probe would not move largely can be formed with high accuracy.

Each through hole of the first, second and third plate-like members may further have a truncated conical shape portion following the small diameter portion and the large diameter portion. By this, a work for inserting the probe into each through hole can be facilitated by disposing a first, a second and a third members so as to enable to pass each probe through the through hole of each plate-like member from the side of the large diameter side.

The distance between the small diameter portions of the first and the second plate-like members can be made smaller than the distance between the small diameter portions of the second and third plate-like members. By this, an excessive displacement due to an over drive can be constrained. Also, when the needle point is pressed against the electrode of the device under test, the probe is surely deformed in the region between the second and third plate-like members.

Each through hole of the third plate-like member may be displaced in one direction relative to the through holes of the first and second plate-like members. By this, when the needle point is pressed against the electrode of the device under test, the probe is surely deformed in the region between the second and third plate-like members.

Each probe may be bent in the region between the second and third plate-like members. By this, when the needle point is pressed against the electrode of the device under test, the probe is surely deformed in the region between the second and third plate-like members.

The electrical connecting apparatus can further comprise an electrically insulating sheet-like member disposed between the second and third plate-like members and penetrated by the probe.

The electrical connecting apparatus can further comprise: a base plate laid on the third plate-like member and including a plurality of through holes individually communicated to the through holes of the third plate-like member and a plurality of tester lands to be connected to a tester; and a plurality of wirings individually inserted into the through holes of the base plate, each wiring being connected to the end portion of the probe.

BRIEF DESCRIPTION OF THE DRAWINGS

FIGS. 3A, B and C are sections for explaining how to assemble the probe assembly, in which FIG. 3A shows a state that the third plate-like member is displaced relative to the first and second plate-like members.

FIGS. 4A and B are partially enlarged sections of the probe assembly, in which FIG. 4A shows a state that the probe is not pressed against the electrode of the device under test, and FIG. 4B shows a state that the probe is pressed against the electrode of the device under test.

FIGS. 6A and B are views showing one embodiment of the probe, in which FIG. 6A is a side view and FIG. 6B a front elevation.

THE BEST MODE FOR WORKING THE INVENTION

Figure 5:
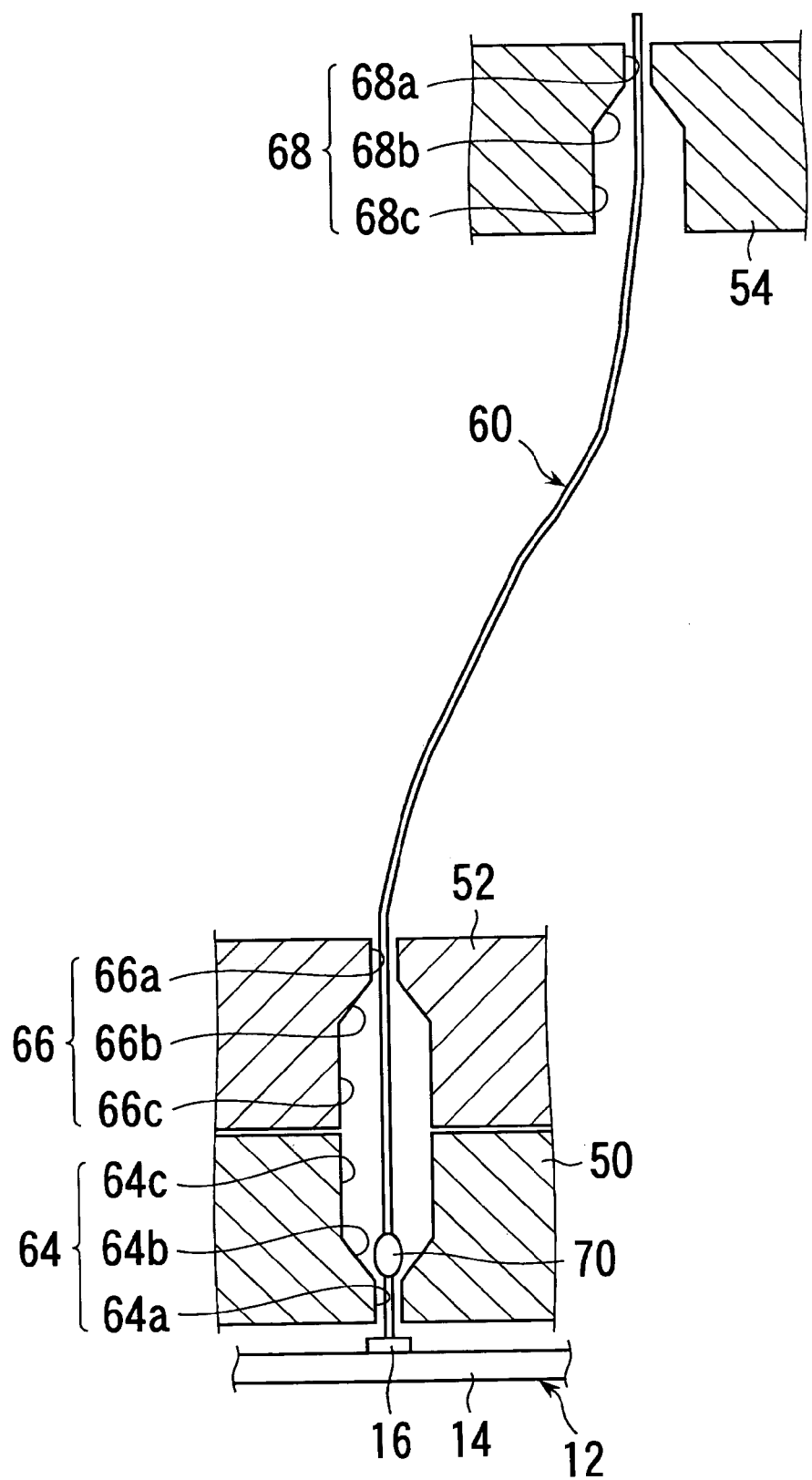
FIG. 5 is a section in which the portion of the through hole is particularly enlarged and emphasized to show one embodiment of the through hole.

Referring to FIGS. 1 through 6, the electrical connecting apparatus 10, as shown in FIGS. 3 and 5, is used as a probe card for testing a plurality (eight in the example shown in FIG. 1) of devices under test 14 such as integrated circuits on a semiconductor wafer 12, simultaneously. Each device under test 14 has a rectangular shape with a plurality of electrodes 16 on each side at intervals in the direction of each side of the rectangle.

The electrical connecting apparatus 10 comprises a circular wiring base plate 20, a connecting base plate 22 assembled into the wiring base plate 20, a plurality of wirings 24 extending from the connecting base plate 22 to the wiring base plate 20, and a probe assembly 26 assembled into the underside of the connecting base plate 22.

The wiring base plate 20 is made of an electrically insulating material such as glass fiber-filled epoxy, ceramic, etc. The wiring base plate 20 has in its center a through hole (opening) 28 penetrating the central region of the wiring base plate 20 in the thickness direction, a plurality of tester lands 30 to be electrically connected to the tester in the circumference in multiplicity, and a plurality of connection lands 32 on the outsides of the two opposing sides of the hole 28.

The hole 28 has a rectangular shape a little larger than a region for placing the integrated circuits to be tested simultaneously. The tester lands 30 and the connection lands 32 are electrically connected in one-to-one correspondence with connecting lines not shown. Such connecting lines may be wirings formed inside the wiring base plate 20 by an appropriate method such as a printed wiring technique.

The connecting base plate 22 is made of an electrically insulating material and is provided with a rectangular plate-like portion 34 a little smaller than the hole 28 of the wiring base plate 20, and a rectangular flange portion 36 formed on the outside of the upper portion of the plate-like portion 34. The connecting base plate 22 is assembled in the flange portion 36 into the top face of the wiring base plate 20 with a plurality of screw members 38 such that the plate-like portion 34 is positioned within the hole 28.

In the illustration, the connecting base plate 22 is constituted such that the plate-like portion 34 whose rectangular upper portion projecting upward of the wiring base plate 20 is smaller than the bottom portion of the rectangle placed within the hole 28 is connected to the annular flange portion 36 on which the upper portion of the plate-like portion 34 is fitted are connected by means of a plurality of screw members 40, but the plate-like portion 34 and the flange portion 36 may be integrated.

The connecting base plate 22 has a plurality of through holes 42 penetrating the plate-like portion 34 in its thickness direction. Each through hole 42 is made to correspond to the individual electrode 16 of the device under test 14.

Each wiring 24 uses, as shown in FIG. 4, a cable protected by an electrically insulating layer 46 which covers the periphery of a conductive core wire 44. One end portion of each wiring 24, with the core wire 44 exposed because its electrically insulating layer 46 is stripped, is inserted into the through hole 42, and is connected at its end portion exposing the corer wire 44 to the connecting base plate 22 by an adhesive 48. Though not shown, the cable has an electrically shielding layer disposed around the electrically insulating layer 46.

One end face of each core wire 44 is substantially kept at the height position of the underside of the connecting base plate 22. The other end portion of each wiring 24 with the electrically insulating layer 46 stripped therefrom is connected to the connection land 32 by a conductive adhesive such as solder at the exposed end portion of the core wire 44.

The probe assembly 26 is formed into a rectangular parallelepiped having a rectangular plane shape a little smaller than the plate-like portion 34 of the connecting base plate 22. The probe assembly 26 places a rectangular second plate-like member 52 on the upper side of a rectangular first plate-like member 50, and a rectangular third plate-like member 54 on the upside of the second plate-like member 52 at intervals, and interposes a rectangular frame member 56 between the second and third plate-like members 52 and 54.

The first plate-like member 50, the second plate-like member 52, the third plate-like member 54 and the frame member 56 are connected by a plurality of screw members 58 in such an overlapped state as mentioned above to constitute a probe support 62 for supporting a plurality of probes 60. The screw members 58 penetrate the third plate-like member 54, the frame member 56 and the second plate-like member 52 to be screwed into the first plate-like member 50.

Each of the first and second plate-like members 50 and 52 has a rectangular recess opening upward, and the third plate-like member 54 has a rectangular recess opening downward. The second plate-like member 52 is laid on the first plate-like member 50 so as to close the recess of the first plate-like member 50. The frame member 56 has a rectangular internal space communicating the recesses of the second and third plate-like members 52 and 54.

As a result, the first and second plate-like members 50 and 52, though the second plate-like member 52 is laid on the first plate-like member 50, are vertically spaced apart in the plate-like portions acting as rectangular central regions When viewed as a plane, the first, second, third plate-like members 50, 52, 54 and the frame member 56 have the same size, and the recesses of the first, second and third plate-like members 50, 52 and 54 and the internal space of the frame member 56 are of the same size.

As shown in FIGS. 3 and 4, the first, second, and third plate-like members 50, 52, and 54 respectively have a plurality of through holes 64, 66 and 68 opening in the corresponding recesses penetrating their central regions, that is, the plate-like portions in their thickness direction. The through holes 64, 66 and 68 are made respectively to correspond to the through holes 42 of the connecting base plate 22.

As shown in FIG. 5, the through holes 64, 66 and 68 are formed to have the same size and shape with small diameter portions 64a, 66a and 68a having small diameters, truncated conical diameter portions 64b, 66b and 68b following the small diameter portions 64a, 66a and 68a, and large diameter portions 64c, 66c and 68c following the truncated conical diameter portions 64b, 66b and 68b, respectively.

Each of the through holes 64, 66 and 68 can form the small diameter portion after forming the large diameter portion. By doing so, even if the thickness dimensions of the first, second and third plate-like members 50, 52 and 54 are great, the thickness dimensions of positions for forming the small diameter portions can be made small, thereby enabling to form with high accuracy tiny through holes within which the tip (needle point) of the probe 60 does not greatly move. Such through holes 64, 66 and 68 can be formed by laser beam machining.

The first plate-like member 50 is formed such that the small diameter portion 64a of the through holes 64 is on the underside, and the second and third plate-like members 52 and 54 are formed such that the small diameter portions 66a and 68a of the through holes 66 and 68 are on the upside.

The through holes 64 and 66 of the first and second plate-like members 50 and 52 are mutually made coincident in a plane orthogonal to the thickness direction but displaced in one direction relative to the through hole 42 of the connecting base plate 22.

On the contrary, the through hole 68 of the third plate-like member 54 is displaced in one direction relative to the through holes 64 and 66 within a plane orthogonal to the thickness direction, but is made coincident with the through hole 42 of the connecting base plate 22.

However, the through holes 42, 64, 66 and 68 in the horizontal direction may be made coincident.

Each probe 60 is made of a conductive metal wire such as a tungsten wire to have a shape of an elastically deformable needle and passed through the through holes 64, 66 and 68. The upper end portion of each probe 60 is inserted into the through hole 68 so as to move vertically, and the upper end face of each probe 60 is positioned substantially at the height position of the top face of the third plate-like member 54 to be brought into contact with the lower end face of the core wire 44 of the wiring 24.

The lower end portion of each probe 60 penetrates the through hole 64 movably in the vertical direction so as to have a slight play relative to the small diameter portion 64a and is made as a needle tip portion projecting downward from the first plate-like member 50.

Figures 6A, 6B:
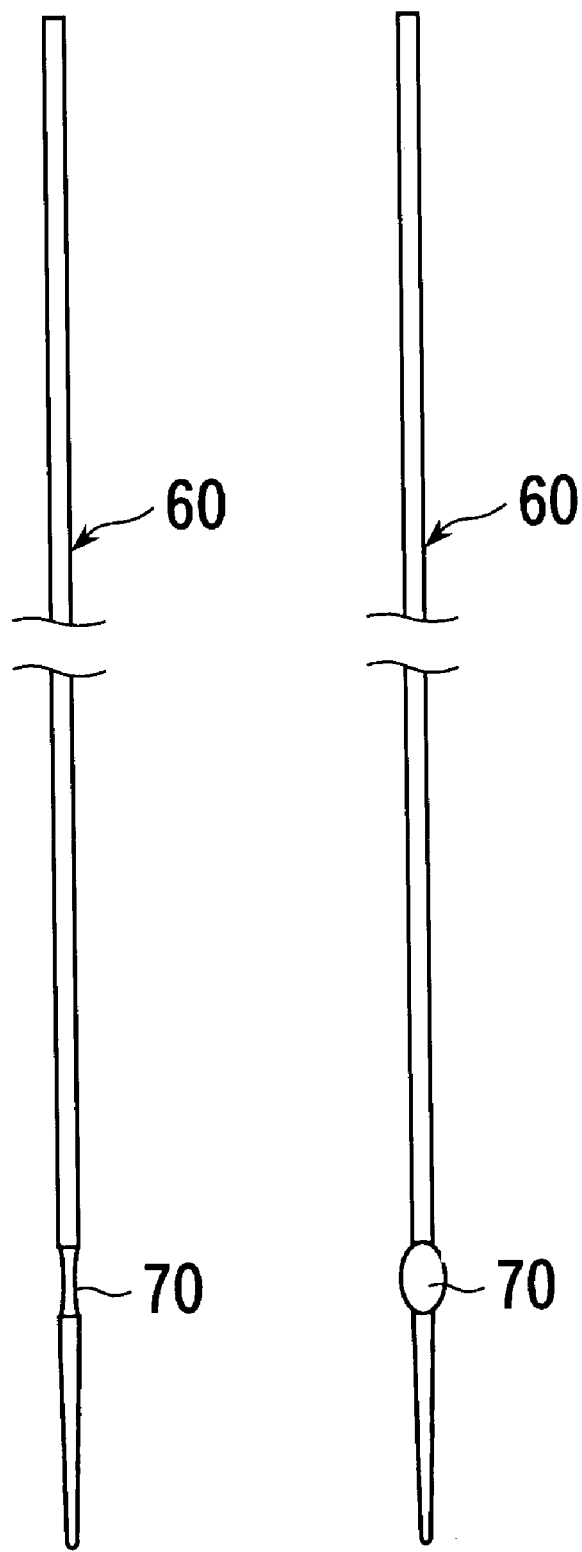

Each probe 60 has a circular sectional shape, of which the diametral dimensions, particularly at the parts of the through holes 64, 66, and 68 are a little smaller than the small diameter portions 64a, 66a and 68a of the through holes 64, 66 and 68, but at the parts of the underside, preferably lower than the projected portion 70, are made smaller toward the side of the tip (needle point) as shown in FIG. 6.

Each probe 60 has a circular sectional shape, of which the diametral dimensions, particularly at the parts of the through holes 64, 66, are a little smaller than the small diameter portions 64a, 66a and 68a of the through holes 64, 66 and 68, but at the parts of the underside, preferably lower than the projected portion 70, are made smaller toward the side of the tip (needle point) as shown in FIG. 6.

Each probe 60 is curved on the same side in a region between the second and third plate-like members 52 and 54, because the through holes 66 and 68 are displaced in one direction within a plane orthogonal to the through holes 66 and 68, and because the projected portion 70 is pressed by the core wire 44 in a state of being in contact with the small diameter portion 64a of the through hole 64.

When the diametral dimension of the probe 60 is made 50±2 μm and the length dimension of the probe 60 is made 65±0.05 μm, the thickness dimensions of the first, second and third plate-like members 50, 52 and 54 can be made respectively 0.7 mm, 0.6 mm and 0.7 mm, and the depth dimensions of the truncated conical diameter portion 64b and the large diameter portion 64c of the through hole 64 can be made 0.5 mm in total.

The probe assembly 26 and the electrical connecting apparatus 10 can be assembled, for example, as follows.

Figure 1:
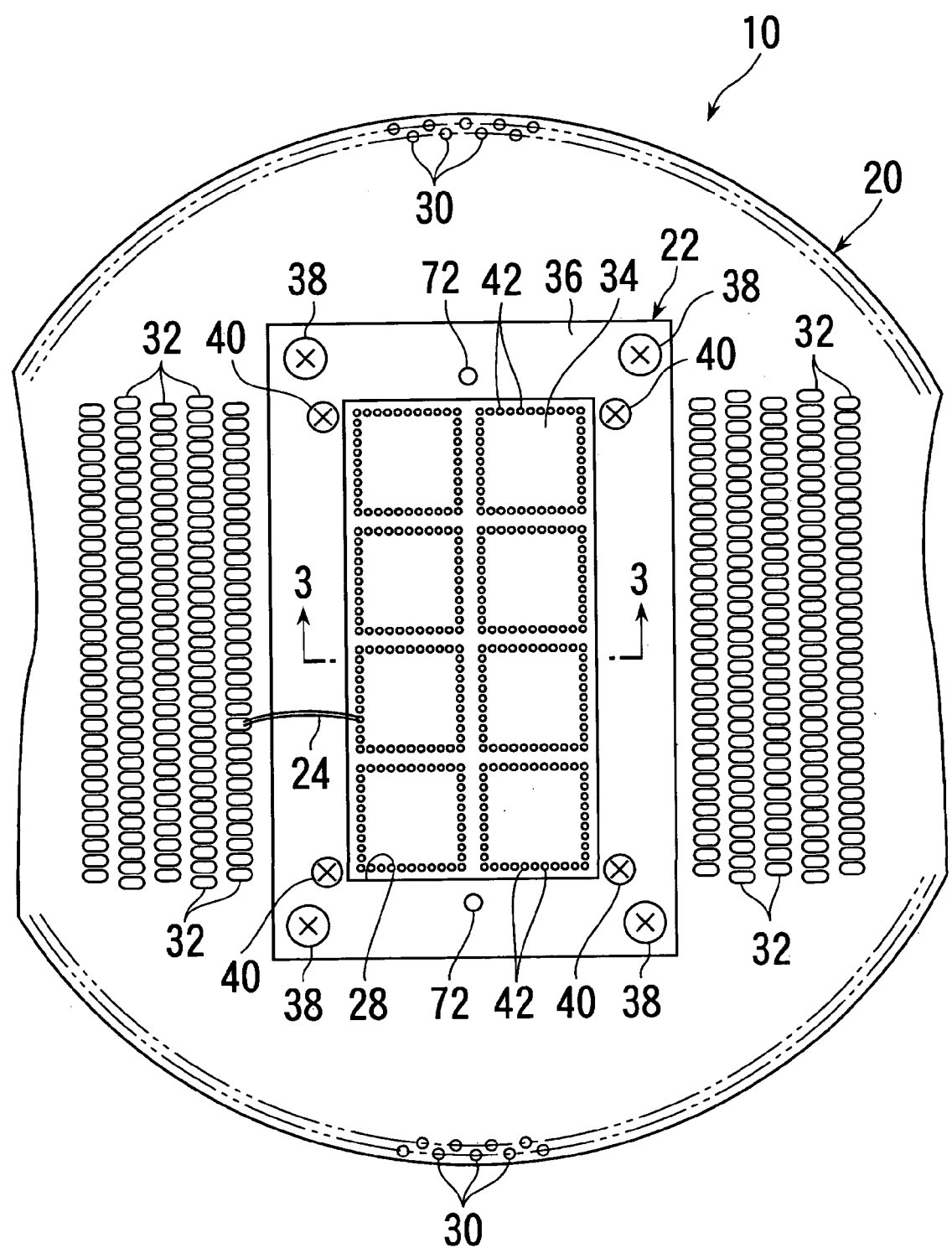
FIG. 1 is a plan view showing one embodiment of the electrical connecting apparatus according to the present invention in which most part of the wiring is omitted.
Figure 2:
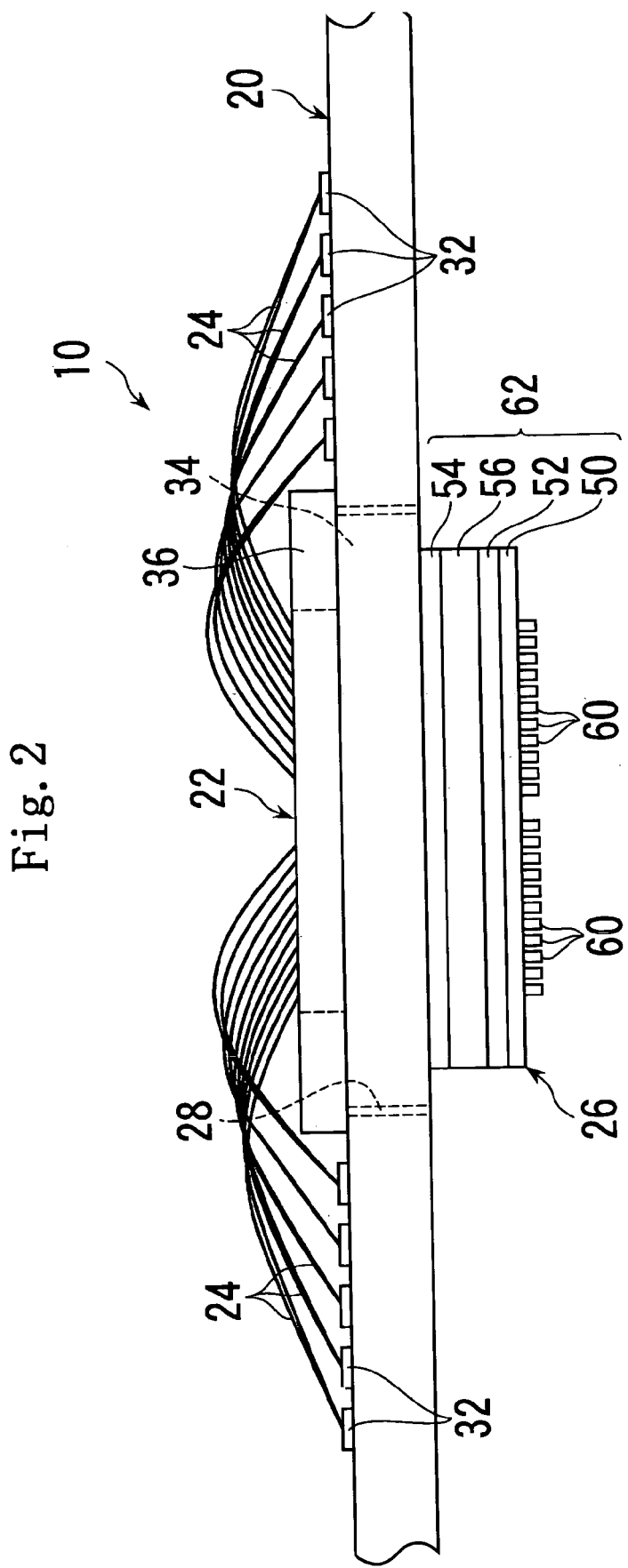
FIG. 2 is a front elevation of the electrical connecting apparatus shown in FIG. 1.
Figure 3A:
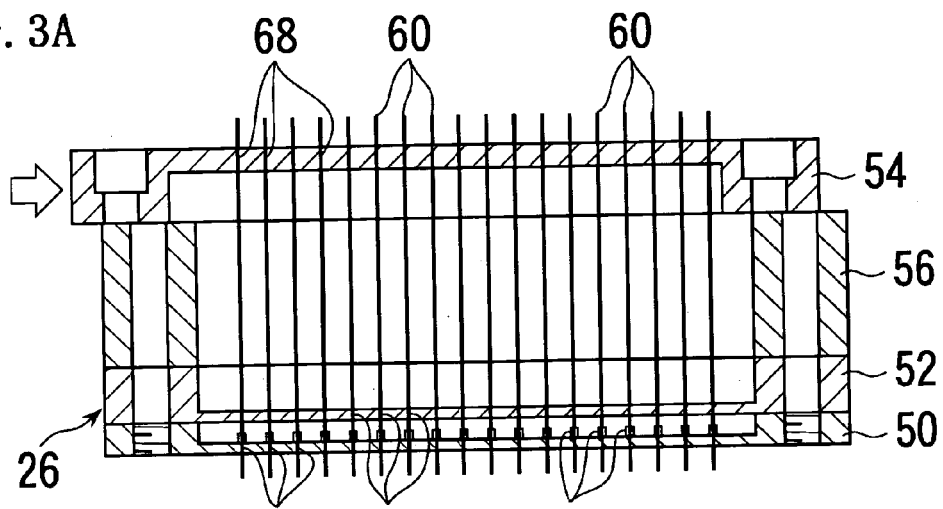

First of all, the first plate-like member 50, the second plate-like member 52, the frame member 56 and the third plate-like member 54 are overlapped as shown in FIG. 3A, such that the tip portion of the probe 60 is passed through the through hole 64 of the first plate-like member 50, a part above the projected portion 70 of the probe 60 is passed through the through hole 66 of the second plate-like member 52, a further upper part of the probe 60 is passed through the frame member 56, and that the upper portion of the probe 60 is passed through the through hole 68 of the third plate-like member 54.

In order to pass the probe 60 through the first, second and third plate-like members 50, 52 and 54 as well as the frame member 56 as mentioned above, the probe 60 may be passed through the through holes 64, 66 and 68 in this order or in the reverse order.

In the state shown in FIG. 3A, the third plate-like member 54 is displaced relative to the first and second plate-like members 50 and 52 as well as the frame member 56, and the first, second and third plate-like members 50, 52 and 54 as well as the frame member 56 are kept such that the through holes 64, 66 and 68 are aligned vertically (so that the axes of the through holes 64, 66 and 68 may coincide).

Also, as shown in FIG. 3A, the probe 60 is passed through the through holes 64, 66 and 68 such that its upper end portion slightly projects from the third plate-like member 54 and that its lower end portion projects downward from the first plate-like member 50. At this time, since the probe 60 can be passed through the through holes 64, 66, 68 from the side of the large diameter portions 64c, 66c and 68c, the inserting operation of the probe 60 into each through hole 64, 66 and 68 is facilitated.

Figure 3B:
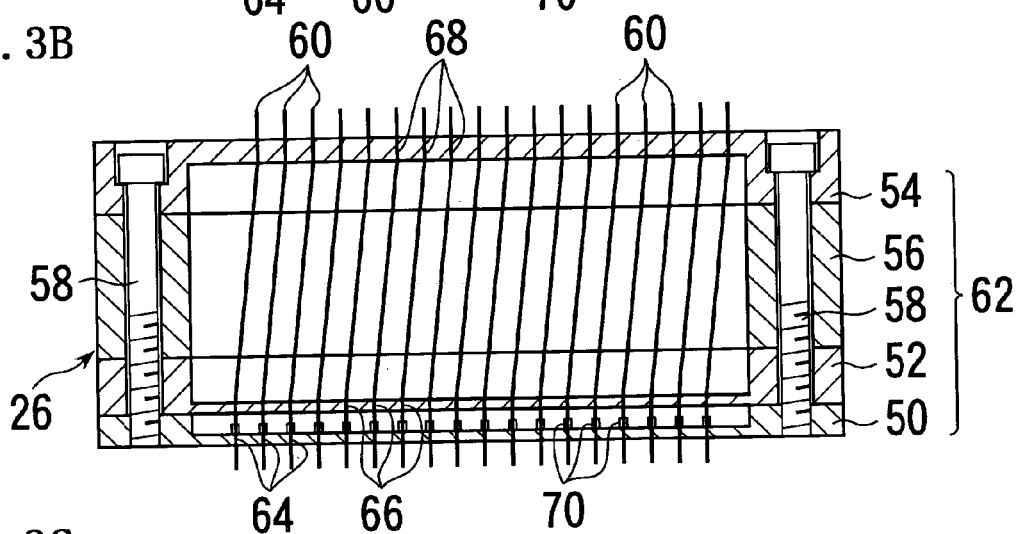
FIG. 3B shows a state that the third plate-like member is moved relative to the first and second plate-like members.
Figure 3C:
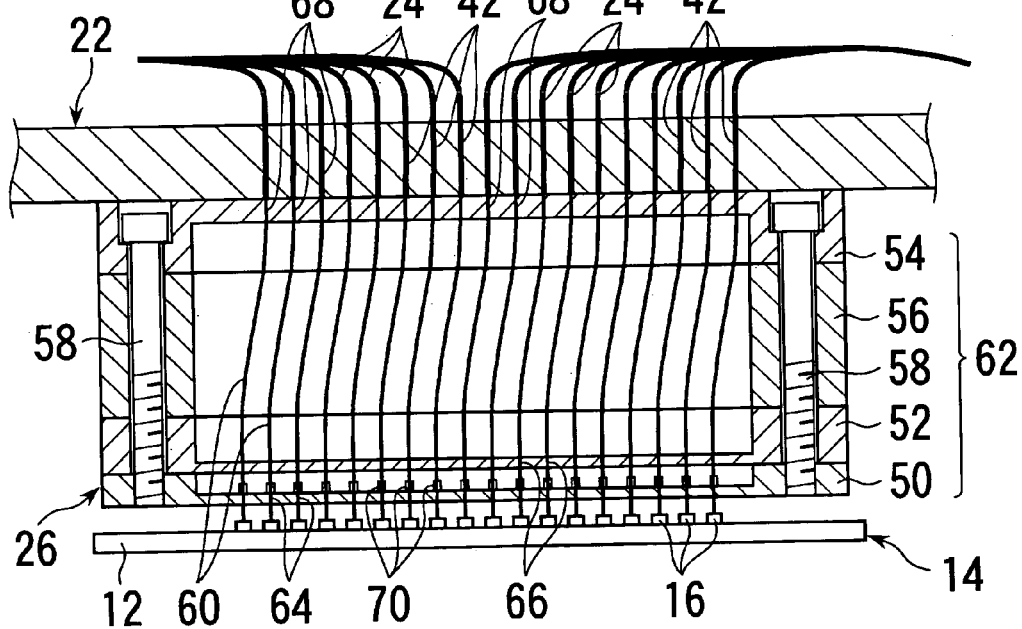
FIG. 3C shows a state that the first, second and third members are connected to the connecting base plate.

Next, as shown in FIG. 3B, the third plate-like member 54 is moved by a predetermined amount in the horizontal direction relative to the first and second plate-like members 50 and 52 so that the first, second and third plate-like members 50, 52 and 54 as well as the frame member 56 may be aligned. Thereby, since the through hole 68 is displaced in the horizontal direction relative to the through holes 64 and 66, the probe 60 is elastically deformed between the second and third plate-like members 52 and 54 to be surely curved.

It is, however, possible to align the first, second and third plate-like members 50, 52 and 54 as well as the frame member 56 in the state shown in FIG. 3B when the probe 60 is passed through the through holes 64, 66 and 68.

Then, as shown in FIG. 3B, the first, second and third plate-like members 50, 52 and 54 are firmly connected in the above-mentioned state by a plurality of screw members 58. The first, second and third plate-like members 50, 52 and 54 may be bonded by an adhesive in place of connecting them by the screw members 58.

The probe assembly 26 assembled as mentioned above, as shown in FIGS. 1, 2 and 3C, is firmly connected to the connecting base plate 22 by a plurality of screw members (not shown). It is possible to assemble the wiring base plate 20 and the connecting base plate 22 after connecting the connecting base plate 22 and the probe assembly 26, or to connect the connecting base plate 22 and the probe assembly 26 after assembling the connecting base plate 22 and the wiring base plate 20.

When the connecting base plate 22 and the probe assembly 26 are connected, the upper end face of each probe 60 is pushed downward by the core wire 44 of the corresponding wiring 24. By this, each probe 60 is pushed downward at its upper end and elastically deformed in the region at a region above the second plate-like member 52.

The physical relation between the first, second and third plate-like members 50, 52 and 54 within a horizontal plane and the physical relation between the probe assembly 26 and the connecting base plate 22 within a horizontal plane are kept in a constant relation by connecting the first plate-like member 50 of the probe assembly 26, positioning the first plate-like member 50, the second plate-like member 52, the frame member 56 and the third plate-like member 54 mutually and combining them by screw members, and by a plurality of positioning pins 72 (see FIG. 1) penetrating the connecting base plate 22 and inserted into the probe assembly 26.

At the time of electrical test of the device under test 14, the electrical connecting apparatus 10 is pressed at the lower end of each probe against the electrode 16 of the device under test 14 in a state that the lower end (needle point) of the probe 60 is in contact with the electrode 16 of the device under test 14.

At this time, since the positioning on the tip side of the probe 60 in the direction orthogonal to the through holes 66, 68 is performed by reciprocal action of the small diameter portions 64a, 66a of the through holes 64, 66, the needle point position in the direction orthogonal to the through holes 64, 66 is stable, and the probe 60 is surely brought into contact with the electrode 16 of the device under test 14.

Also, since each through hole 64 of the first plate-like member 50 directs its small diameter portion 64a downward, the length dimension of the probe 60 from the needle point to the small diameter portion of the through hole 64 becomes smaller than when the small diameter portion 64a is positioned upward. Thereby, since displacement of the probe in the region from the small diameter portion 64a to the needle point side is constrained, displacement of the needle point in the direction orthogonal to the through hole 64 is decreased, and the position of the needle point relative to the electrode 16 of the device under test 14 becomes more stable.

When the lower end of the probe 60 is pressed against the electrode 16 of the device under test 14, the probe 60, as shown in FIG. 4B, receives a predetermined over drive OD, and is elastically deformed in the region between the second and third plate-like members 52 and 54. Thereby, the probe 60, which is passed through the small diameter portions 64a and 66a of the through holes 64 and 66 with a play, moves its lower end slightly in the horizontal direction relative to the electrode 16 and gives a scraping action to the electrode 16.

Excessive displacement of the probe 60 due to the above-mentioned over drive can be constrained because the space between the small diameter portions 64a and 66a of the first and second plate-like members 50 and 52 is smaller than the space between the small diameter portion 66a and 68a of the second and third plate-like members 52 and 54. Also, the probe 60 is surely deformed in the region between the second and third plate-like members 52 and 54 by the over drive.

Figure 7:
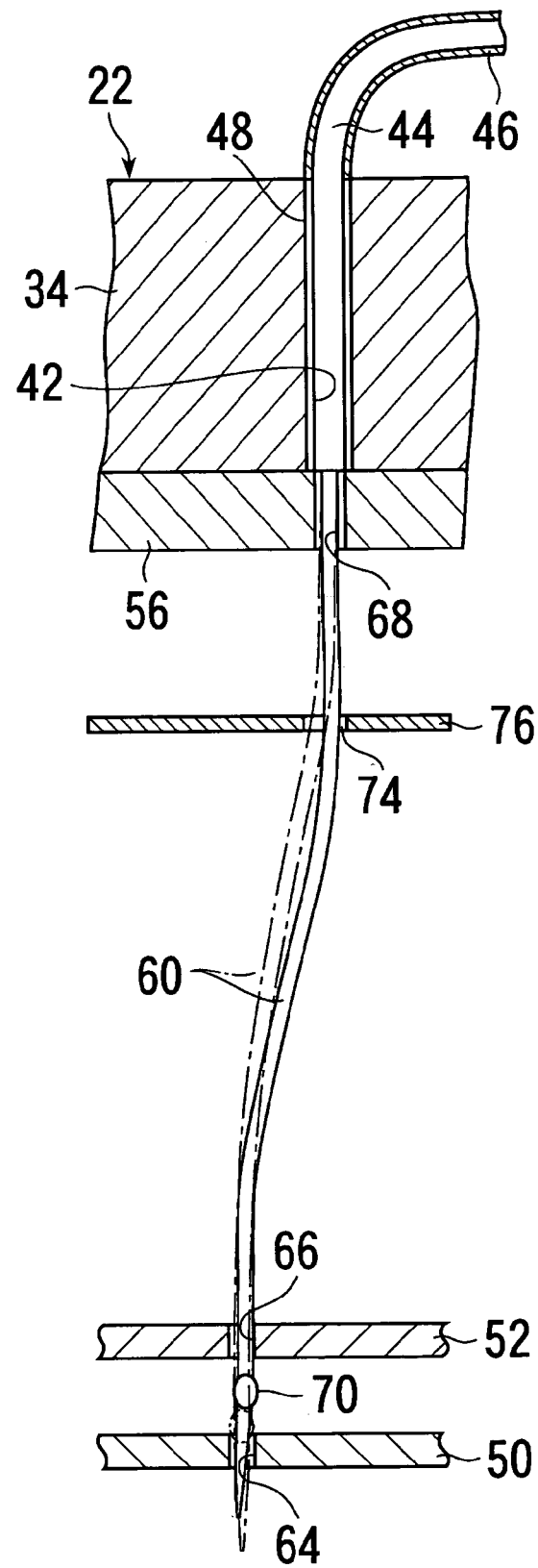
FIG. 7 is an enlarged section showing another embodiment of the probe assembly.

As shown in FIG. 7, it is possible to dispose a guide film 76 having a plurality of holes 74 through which the individual probes 60 pass between the second and third plate-like members 52 and 54 to regulate the curving direction of the probes 60. In this case, the holes 74 can be long holes elongated in the curving direction of the probes 60.

In the embodiment shown in FIG. 7, the axis of the through hole 68 is displaced relative to the axes of the through holes 64, 66 in a state of being assembled into the probe assembly 26, it is possible to curve by the guide film 76 in place of such displacement.

The present invention can be used either by placing the probe assembly upward or downward of the device under test or by inclining the probe assembly.

The present invention is not limited to the above embodiments but can be variously modified without departing from its purport.

What is claimed:

1. An electrical connecting apparatus comprising:
   a first, second and third plate-like members having plate-like portions spaced apart from each other in the thickness direction so that the plate-like portion of said second plate-like member may be positioned between said plate-like portions of said first and third plate-like members, each of the plate-like portions having a plurality of through holes penetrating in the thickness direction in said plate-like portions; and
   a plurality of probes passed through the through holes of said first, second and third plate-like members and having projected portions between said first and second plate-like members
   wherein each of the through holes of said first and second plate-like members has a small diameter portion for preventing said projected portion of said probe from passing through and a large diameter portion communicated to said small diameter portion and capable of receiving said projected portion,
   wherein each probe is curved in a region between said second and third plate-like members.

2. An electrical connecting apparatus as claimed in claim 1, wherein each through hole of said first plate-like member has said small diameter portion positioned on the side opposite to second plate-like member.

3. An electrical connecting apparatus as claimed in claim 2, wherein each through hole of said third plate-like member has a small diameter portion for preventing said projected portion of said probe from passing and a large diameter portion transitioning to said small diameter portion.

4. An electrical connecting apparatus as claimed in claim 3, wherein each through hole of said first, second and third plate-like members further has a truncated conical portion following said small diameter portion and said large diameter portion.

5. An electrical connecting apparatus as claimed in claim 1, wherein the distance between said small diameter portions of said first and second plate-like members is less than the distance between said small diameter portion of said second and third plate-like members.

6. An electrical connecting apparatus as claimed in claim 1, wherein each through hole of said third plate-like member is displaced in one direction relative to the through holes of said first and second plate-like members.

7. An electrical connecting apparatus as claimed in claim 1, further comprising an electrically insulating sheet-like member disposed between said second and third plate-like members and penetrated by said probe.

8. An electrical connecting apparatus as claimed in claim 1, further comprising a base plate laid on said third plate-like member and including a plurality of through holes individually transitioning to the through holes of said third plate-like member and a plurality of tester lands to be connected to a tester; and a plurality of wirings individually inserted into the through holes of said base plate, each wiring being connected to the end portion of said probe.

* * * * *